United States Patent [19]

Hirose

[11] Patent Number: 4,685,777

[45] Date of Patent: Aug. 11, 1987

[54] REFLECTION AND REFRACTION OPTICAL SYSTEM

[75] Inventor: Ryusho Hirose, Kawasaki, Japan

[73] Assignee: Canon Kabushiki Kaisha, Tokyo, Japan

[21] Appl. No.: 813,223

[22] Filed: Dec. 24, 1985

[30] Foreign Application Priority Data

Dec. 27, 1984 [JP] Japan ............................. 59-280573

[51] Int. Cl.[4] ............................................. G02B 17/08
[52] U.S. Cl. ...................................... 350/505; 350/442
[58] Field of Search ................. 350/505, 504, 442–446

[56] References Cited

U.S. PATENT DOCUMENTS

| | | | |
|---|---|---|---|
| 3,455,623 | 7/1969 | Harris | 350/505 |
| 4,293,186 | 10/1981 | Offner | 350/27 |
| 4,395,095 | 7/1983 | Horton | 350/505 |
| 4,469,414 | 9/1984 | Shafer | 350/444 |

FOREIGN PATENT DOCUMENTS 637772 12/1978 U.S.S.R. .............................. 350/442

Primary Examiner—Jon W. Henry
Attorney, Agent, or Firm—Fitzpatrick, Cella, Harper & Scinto

[57] ABSTRACT

An off-axis imaging optical system, includes: a first imaging optical system including a reflection optical element and a refraction optical element; a second imaging optical system including a reflection optical element and a refraction optical element, wherein the second imaging optical system is disposed with respect to the first imaging optical system so as to reimage an image formed by the first imaging optical system; wherein one of the first and second imaging optical system has unit magnification or enlarging magnification imaging power, and the other imaging optical system has a reducing magnification imaging power, so as to provide a reducing magnification power as a whole.

7 Claims, 3 Drawing Figures

REFLECTION AND REFRACTION OPTICAL SYSTEM

FIELD OF THE INVENTION AND RELATED ART

The present invention relates to a reflection and refraction optical system, and more particularly to an optical system for semiconductor circuit manufacturing apparatus.

There have been proposed various optical systems wherein a projection exposure apparatus is used for printing a pattern of IC and LSI on a silicon wafer, for example, in U.S. Pat. Nos. 3,748,015, 4,097,125, 4,293,186 and 4,469,414. In the devices of U.S. Pat. Nos. 3,748,015 and 4,097,125, two mirrors, i.e. a concave mirror and a convex mirror are used with their centers of curvature being coincident or not coincident, so that the overall imaging magnification is unit, thus constituting a unit magnification imaging optical system. In the device of U.S. Pat. No. 4,293,186, a meniscus lens having a negative power is used in addition to concave and convex mirrors so as to improve the optical performance. U.S. Pat. No. 4,469,414 proposes a unit magnification reflection and refraction optical system in which the optical performance is improved by the combination of a reflection optical system and a refraction optical system. In these latter two discussed references, for example, such systems are referred to as "off-axis field optical systems" or "off-axis imaging optical systems". Such denotation refers to the fact that the aberrations which are sought to be corrected are solely those within the range of the off-axis field, that is to say, those aberrations which are spaced apart from the optical axis.

Since the conventional imaging optical systems are unit magnification ones, the optical system may be symmetrical, so that the comatic aberration and the distortion among various aberrations are zero, with the result that a relatively high performance optical system can be easily accomplished.

On the other hand, a step-and-repeat type projection exposure apparatus, wherein the pattern of a mask is reduced and projected onto a wafer surface so as to expose the wafer surface to the pattern in a reduced magnification, has been put into practice in the field of IC manufacturing in consideration of the difficulty in manufacturing the mask, the existence of foreign matter, the undulation of the wafer and the overall throughput.

If, however, one tries to construct a reduction reflection imaging optical system for a projection exposure apparatus, the optical system must be asymmetrical, resulting in the production of comatic aberration and the like, as contrasted to the case of the unit magnification optical system. Therefore, it is difficult to maintain good optical performance. Particularly in the case of the optical system having an imaging magnification of $\frac{1}{4}$–1/10, it involves remarkable difficulties in correcting the distortions in good order.

SUMMARY OF THE INVENTION

Accordingly, it is a principal object of the present invention to provide a reflection and refraction optical system which can produce a reduced image under good performance, and which has a large aperture ratio which is convenient for use with the projection exposure optical apparatus in semiconductor circuit manufacturing.

According to a preferred embodiment of the present invention, the optical system comprises a first imaging optical system and a second imaging optical system for reimaging the image produced by the first optical system, wherein each of the two imaging optical systems contains a reflection optical element and a refraction optical element, and wherein one of the imaging optical systems has an enlarging or unit magnification power, while the other imaging optical system has a reducing magnification power, whereby the overall magnification is a reduction. The reflection and refraction optical system thus constructed accomplishes the object.

In more detail, a first imaging system having a reducing magnification power and a second optical system having an enlarging magnification power which are effective to form an image in a predetermined region adjacent their optical axes, are arranged optically sequentially. The first imaging system forms a first image from light rays from the object by way of a concave mirror, a convex mirror, a concave mirror and a meniscus lens. The second imaging system forms a second image of the first image by way of two meniscus lenses, a concave mirror and two meniscus lenses so that the overall magnification is a reducing one.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
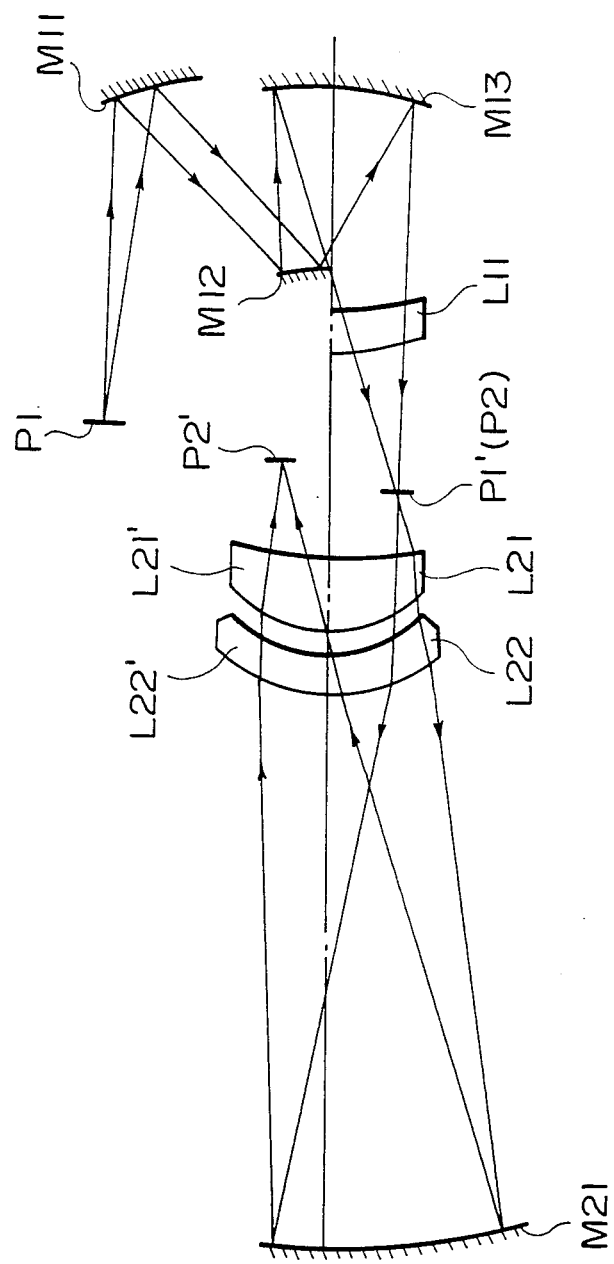
FIG. 1 shows an optical arrangement of a reflection and refraction optical system according to an embodiment of the present invention.

Referring now to FIG. 1, there is shown an optical system according to an embodiment of the present invention. The reflection and refraction optical system of FIG. 1 comprises a first imaging optical system having a reducing imaging power including three reflecting mirrors, i.e., a concave mirror M11, a convex mirror M12 and a concave mirror M13, and a meniscus lens L11. If further comprises a second imaging optical system having an enlarging imaging power including two meniscus lenses L21 and L22, a concave mirror M21 and two meniscus lenses L22' and L21'. Those optical elements are arranged in the order named from the object side. Those optical elements have a common optical axis. The optical elements of the first imaging system have centers of curvature at the same side, and the optical elements of the second imaging system have the centers of curvature at the same side, as will be understood from FIG. 1.

A beam from an object point P1 located within a predetermined region adjacent the optical axis is reflected by the reflecting mirrors M11, M12 and M13 and are imaged at a first image point P1' through the meniscus lens L11. The first imaging point P1' is an object point P2 of the second imaging system and is imaged at a second imaging point P2' through the two lenses L21 and L22, a concave mirror M21 and two lenses L22' and L21'.

In this embodiment, the aberrations produced by the reflecting mirrors are corrected in harmony by forming the first image P1' of the object point P1 with the first imaging system by way of three reflecting mirrors (the concave mirror M11, the convex mirror M12 and the concave mirror M13) having positive power, negative power and positive power, respectively and a meniscus lens L11.

Particularly, the off-axis aberration and the comatic aberration which, are liable to occur in a reduction system, are corrected in good order by passing only the light rays that are reflected by the concave mirror M13, through the meniscus lens L11.

The lens L11 effectively compensate the chromatic aberration produced by the refracting optical elements in the second imaging optical system so as to make it easy to correct the aberrations of the second imaging system.

The aberrations remaining after the first imaging system and the chromatic aberration of the second imaging system are corrected in good order by constituting the second imaging optical system so that the beam from the object point P2 is transmitted through the two meniscus lenses L21 and L22, is reflected by the concave mirror M21, and is transmitted through two meniscus lenses L22' and L21', whereafter it is imaged on the second imaging point as the image P2'.

Figure 2A:
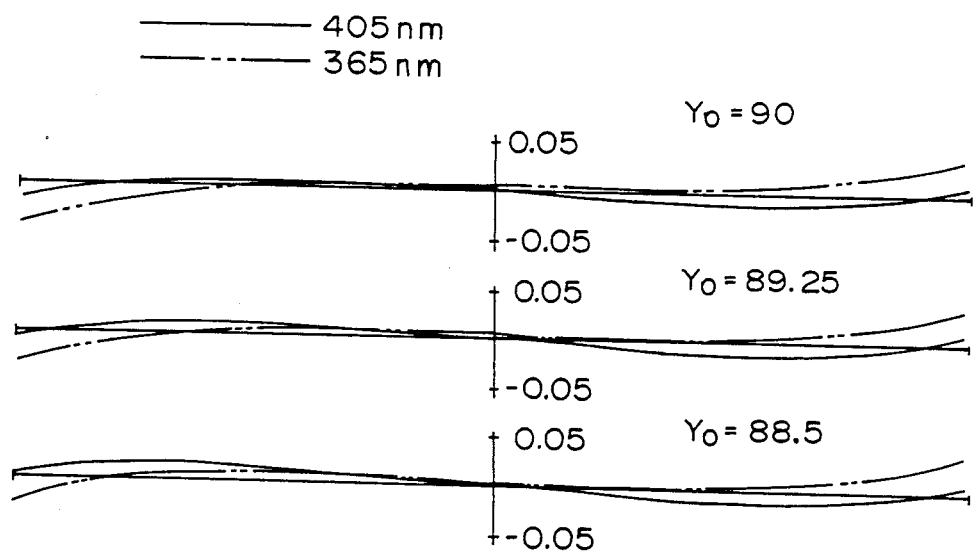
FIG. 2A and FIG. 2B show aberrations of the optical elements used in the optical system illustrated in FIG. 1.
Figure 2B:
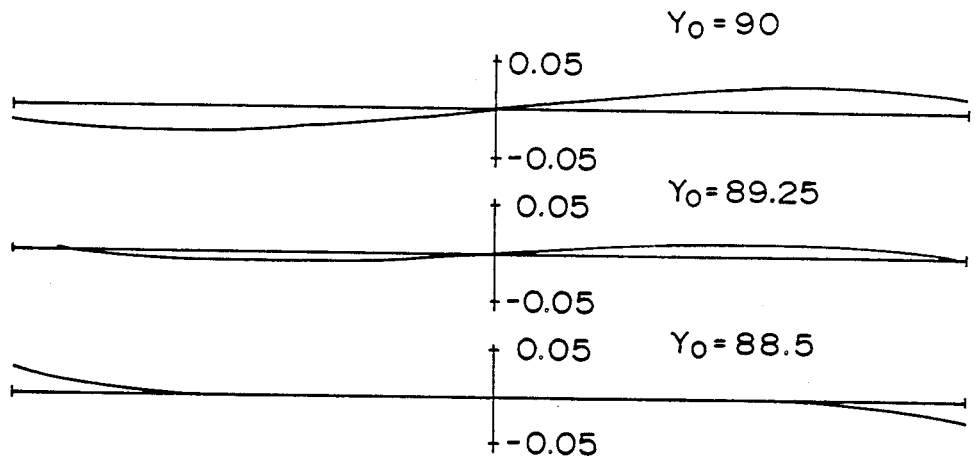

Although the lenses are made of one and the same material (quartz glass) which exhibits a good transmission factor for short wavelength light (230–400 nm), the chromatic aberration is satisfactorily corrected as shown in FIGS. 2A and 2B by defining the shapes of the lenses in the manner described hereinbefore. By passing the beam from the object point P2 through the two lenses L21 and L22 and through the two lenses L22' and L21', the aperture ratio is increased, while the amounts of the aberrations such as the comatic aberration and the off-axis halo are reduced, and simultaneously the chromatic aberration is corrected satisfactorily together with the first imaging system. In addition, although the reflection optical system is employed, the eclipse of the light is minimized.

In this embodiment, the magnification of the first imaging optical system is 0.11, whereas the magnification of the second imaging optical system is 2.26, whereby a reduction reflection and refraction optical system having an overall magnification of 0.25 is established.

By constituting one of the imaging optical system as an enlarging system and the other imaging optical system as a reduction system so as to provide a reduction system as a whole, various aberrations such as off-axis spherical aberration, comatic aberration and distortion produced in each of the imaging systems are satisfactorily corrected, and a reflection and refraction optical system having a large aperture ratio is easily accomplished by a simple construction.

In order to provide a reducing optical system having a high resolving power with a much better correction of the off-axis spherical aberration, the comatic aberration and chromatic aberration in this embodiment, it is preferable that the lens L11 is a meniscus lens having its concave surface facing toward the concave mirror M13, and that the lenses L21, L22, L21' and L22' are all meniscus lenses having their convex surfaces facing toward the concave mirror M21. Further, it is preferable that the lenses L11, L21 and L21' each have positive power, while the lenses L22 and L22' each have negative power, from the standpoint of good aberration correction.

In this embodiment, the description has been made with respect to the case where a single lens functions as the lens L21 and the lens L21', and another single lens functions as the lens L22 and the lens L22'. However, the lenses L21 and L21', and/or the lenses L22 and L22' may be constituted by separate lenses, respectively, whereby the latitude is increased so that the aberration correction is effected in good order. The lens L11 may be constituted by two or more meniscus lenses.

In this embodiment, the principal ray from the object point P1 crosses the optical axis between the convex mirror M12 and the concave mirror M13 and between the concave mirror M21 and the lens L22'. Because of this arrangement, the size of the optical system as a whole is reduced, and also the eclipse of the light is minimized, thus providing a reflection and refraction optical system having high performance.

In this embodiment, all the lenses are made of the same glass material. The material may be $CaF_2$ which exhibits a good transmission factor for light having a short wavelength.

Now, figures of various elements of the FIG. 1 embodiment will be described.

TABLE

|    | R       | D       | N       |
|----|---------|---------|---------|
| 1  | −240    | −65     | −1      |
| 2  | −40     | 62      | 1       |
| 3  | −103    | −79     | −1      |
| 4  | 70.24   | −13.5   | —$SiO_2$ |
| 5  | 65.22   | −72.35  | −1      |
| 6  | 117.84  | −25.5   | —$SiO_2$ |
| 7  | 42.63   | −7.65   | −1      |
| 8  | 39.88   | −14.0   | —$SiO_2$ |
| 9  | 59.61   | −189.0  | −1      |
| 10 | 282.38  | 189.0   | 1       |
| 11 | 59.61   | 14.0    | $SiO_2$ |
| 12 | 39.88   | 7.65    | 1       |
| 13 | 42.63   | 25.5    | $SiO_2$ |
| 14 | 117.84  |         | 1       |

NA = 0.25
Slit Width = 1.5 mm
Magnification ¼
Refractive Index of $SiO_2$
1.474730 for 365 nm of wavelength
1.469820 for 405 nm of wavelength
In the above table,
Ri: Radius of curvature of (i)th surface of a mirror or lens as counted from the object point P1 along the optical axis;
Di: Lens thickness or air space between (i)th surface and (i+1)th surface as counted from the object point P1 along the optical axis; and
$SiO_2$: Refractive index of quartz glass.

The figures of the air space intervals and the refractive indexes are indicated as positive when measured from lefthand side to the righthand side in the direction of the travel of the light, and as negative in the opposite direction.

FIGS. 2A and 2B show various aberrations of the optical system constituted in accordance with the Table. In these Figures, lateral aberrations are shown, wherein FIG. 2A indicates the aberration in the sagittal image plane, and FIG. 2B indicates the aberration in the meridional image plane, and "$Y_0$" is height of the object. It will be understood that the aberrations are connected sufficiently.

As described in the foregoing, in a reflection and refraction optical system, the first and second imaging optical systems, each having a reflective optical system and a refractive optical system, are arranged optically sequentially; one of the imaging optical systems has unit or enlarging power, while the other imaging optical system has reducing power, so that a reducing power as a whole is provided. Because of this arrangement, the imaging performance is well maintained within a predetermined region adjacent the optical axis, and the aperture ratio can be made large with good performance. Particularly, a part of the reflective optical system is used with a refractive optical system comprises a meniscus lens, whereby a reduction reflective and refractive optical system having a large aperture ratio can be provided with satisfactory correction of chromatic aberration.

In the foregoing description of the preferred embodiment, the second imaging optical system has been an enlarging optical system. This is preferable, but it may be a unit magnification optical system.

While the invention has been described with reference to the structures disclosed herein, it is not confined to the details set forth and this application is intended to cover such modifications or changes as many come within the purposes of the improvements or the scope of the following claims.

What is claimed is:

1. An off-axis imaging optical system, comprising:
  a first imaging optical system including a reflection optical element and a refraction optical element;
  a second imaging optical system including a reflection optical element and a refraction optical element, wherein said second imaging optical system is disposed with respect to said first imaging optical system so as to reimage an image formed by said first imaging optical system; and
  wherein at least one of said optical elements has its working surface off a common optical axis of other optical elements
  wherein one of said first and second imaging optical systems has unit magnification or enlarging magnification imaging power, and the other imaging optical system has a reducing magnification imaging power, so as to provide a reducing magnification power as a whole.

2. An optical system according to claim 1, wherein said first imaging optical system has a reducing magnification imaging power, and said second imaging optical system has an enlarging magnification imaging power.

3. An optical system according to claim 1, wherein said second optical system includes a meniscus lens as said refraction optical element.

4. An optical system according to claim 2, wherein said first imaging optical system includes a first concave mirror, a convex mirror, a second concave mirror and a meniscus lens disposed in the order named from an object side in a direction of travel of light from the object side, and wherein said second imaging optical system includes first two meniscus lenses, a concave mirror and second two meniscus lenses disposed in the order named from the object side in said direction.

5. An optical system according to claim 4, wherein said meniscus lens in the first imaging optical system has concave surfaces facing toward the second concave mirror of said first imaging optical system.

6. An optical system according to claim 4, wherein said lenses of said second imaging optical system have convex surfaces facing toward said concave mirror of said second imaging optical system.

7. An optical system according to claim 4, wherein in said second imaging optical system, one of said first two meniscus lenses and one of said second two meniscus lenses constitute a single lens, and wherein the other of said first two meniscus lenses and the other of said second two meniscus lenses constitute another single lens.

* * * * *

UNITED STATES PATENT AND TRADEMARK OFFICE
CERTIFICATE OF CORRECTION

PATENT NO. : 4,685,777

DATED : August 11, 1987

INVENTOR(S) : RYUSHO HIROSE

It is certified that error appears in the above-identified patent and that said Letters Patent is hereby corrected as shown below:

<u>AT [57] IN THE ABSTRACT</u>

Line 9,   "system" should read --systems--.

<u>COLUMN 2</u>

Line 49,   "If" should read --It--.
    Line 63,   "are" should read --is--.

<u>COLUMN 3</u>

Line 10,   "aberration which," should read --aberration, which--.
    Line 14,   "compensate" should read --compensates--.

<u>COLUMN 5</u>

Line 14,   "comprises" should read --comprising--.
    Line 27,   "many" should read --may--.

UNITED STATES PATENT AND TRADEMARK OFFICE
CERTIFICATE OF CORRECTION

PATENT NO. : 4,685,777

DATED : August 11, 1987

INVENTOR(S) : RYUSHO HIROSE

It is certified that error appears in the above-identified patent and that said Letters Patent is hereby corrected as shown below:

COLUMN 6

Line 3, "elements" should read --elements;--.

Signed and Sealed this

Twenty-ninth Day of December, 1987

Attest:

DONALD J. QUIGG

Attesting Officer

Commissioner of Patents and Trademarks